US010699917B2

(12) United States Patent
Ito et al.

(10) Patent No.: US 10,699,917 B2
(45) Date of Patent: Jun. 30, 2020

(54) RESIN-SEALED VEHICLE-MOUNTED CONTROL DEVICE

(71) Applicant: HITACHI AUTOMOTIVE SYSTEMS, LTD., Hitachinaka-shi, Ibaraki (JP)

(72) Inventors: Maki Ito, Tokyo (JP); Toshiaki Ishii, Tokyo (JP); Yoshio Kawai, Hitachinaka (JP); Nobutake Tsuyuno, Tokyo (JP); Yujiro Kaneko, Hitachinaka (JP); Takayuki Fukuzawa, Hitachinaka (JP); Masahiko Asano, Hitachinaka (JP)

(73) Assignee: HITACHI AUTOMOTIVE SYSTEMS, LTD., Hitachinaka-Shi, Ibaraki (JP)

( * ) Notice: Subject to any disclaimer, the term of this patent is extended or adjusted under 35 U.S.C. 154(b) by 0 days.

(21) Appl. No.: 16/081,515

(22) PCT Filed: Feb. 1, 2017

(86) PCT No.: PCT/JP2017/003512
§ 371 (c)(1),
(2) Date: Aug. 31, 2018

(87) PCT Pub. No.: WO2017/150053
PCT Pub. Date: Sep. 8, 2017

(65) Prior Publication Data
US 2019/0080931 A1 Mar. 14, 2019

(30) Foreign Application Priority Data
Mar. 4, 2016 (JP) ................................ 2016-041707

(51) Int. Cl.
*H05K 1/00* (2006.01)
*H01L 21/56* (2006.01)
(Continued)

(52) U.S. Cl.
CPC ........ *H01L 21/565* (2013.01); *H01L 23/3107* (2013.01); *H01L 25/07* (2013.01);
(Continued)

(58) Field of Classification Search
USPC ......................................................... 361/748
See application file for complete search history.

(56) References Cited

U.S. PATENT DOCUMENTS

| 7,084,355 B2* | 8/2006 | Kosaka ................ H05K 1/0271 174/261 |
| 2010/0242273 A1* | 9/2010 | Sugimoto .............. H05K 3/284 29/841 |
| 2014/0058196 A1* | 2/2014 | Tanaka ................ H01L 23/3121 600/103 |

FOREIGN PATENT DOCUMENTS

| JP | 48-045406 U | 6/1973 |
| JP | 11-150214 A | 6/1999 |

(Continued)

OTHER PUBLICATIONS

International Search Report, PCT/JP2017/003512, dated Apr. 11, 2017, 2 pgs.
(Continued)

*Primary Examiner* — Andargie M Aychillhum
(74) *Attorney, Agent, or Firm* — Volpe and Koenig, P.C.

(57) ABSTRACT

An object is to provide the structure of an ECU enabling resin to be filled without deformation of an electronic circuit board. A resin-sealed vehicle-mounted control device includes: a circuit board; a base member housing the circuit board; and resin filled between the circuit board and the base member. The base member has: a base portion fixing the circuit board; and a side wall opposed to the side surface side of the circuit board. The resin is provided at least between the circuit board and the base portion. The side wall has an opening at any position on the side of the base portion from
(Continued)

a position opposed to the side surface side of the electronic circuit board.

9 Claims, 6 Drawing Sheets

(51) Int. Cl.
| | | |
|---|---|---|
| H01L 23/31 | (2006.01) | |
| H05K 5/00 | (2006.01) | |
| H05K 3/28 | (2006.01) | |
| H01L 25/18 | (2006.01) | |
| H01L 25/07 | (2006.01) | |
| H05K 1/18 | (2006.01) | |

(52) U.S. Cl.
CPC ............... *H01L 25/18* (2013.01); *H05K 1/18* (2013.01); *H05K 3/284* (2013.01); *H05K 5/0034* (2013.01); *H05K 5/0056* (2013.01); *H05K 5/0069* (2013.01); *H05K 2201/10303* (2013.01); *H05K 2201/10371* (2013.01); *H05K 2203/1316* (2013.01); *H05K 2203/1327* (2013.01)

(56) References Cited

FOREIGN PATENT DOCUMENTS

| | | | | |
|---|---|---|---|---|
| JP | 2000-183277 | * | 6/2000 | ............. H01L 25/07 |
| JP | 2000-183277 A | | 6/2000 | |
| JP | 2010-056355 A | | 3/2010 | |
| JP | 2010-199152 A | | 9/2010 | |
| JP | 2014-015080 A | | 1/2014 | |
| JP | 2014-203871 A | | 10/2014 | |

OTHER PUBLICATIONS

Japanese Office Action dated Sep. 3, 2019 for the Japanese Patent Application No. 2016-041707.

* cited by examiner

RESIN-SEALED VEHICLE-MOUNTED CONTROL DEVICE

TECHNICAL FIELD

The present invention relates to a vehicle-mounted control device to be mounted on an automobile, including: a circuit board having an electronic component implemented; and a base having a side wall covering the circuit board, and particularly relates to an electronic control device including a circuit board and a base sealed with resin.

BACKGROUND ART

Conventionally, a vehicle-mounted control device (electronic control unit (ECU)) to be mounted on an automobile, typically includes: a circuit board having an electronic component, such as a semiconductor component, implemented: and a casing housing the circuit board. The casing typically consists of: a base fixing the circuit board; and a cover integrated with the base, the cover covering the circuit board.

Such vehicle-mounted control devices are recently required to be miniaturized due to limitations of space. The vehicle-mounted control devices each are to be installed in a large-vibration space, such as an engine room, an in-engine, or an in-automatic-transmission, and thus each is required to have vibration proof. Depending on an installed location, an electromagnetic wave emitted from a different electronic apparatus, causes a problem in addition to vibration, and thus electro-magnetic compatibility (EMC) is required to be ensured.

For such requirements, for example, PTL 1 discloses a technique of filling resin (sealing agent 50) between an electronic circuit board and a base member (resin container 20), the electronic circuit board having electronic components implemented on both surfaces thereof, the electronic circuit board being housed in the base member having a side wall.

PTL 2 discloses a technique of filling resin (insulating resin 9) from an injecting hole provided to a side surface of a base member (lid 3).

CITATION LIST

Patent Literature

PTL 1: JP 2000-183277 A
PTL 2: JP 2014-15080 A

SUMMARY OF INVENTION

Technical Problem

As in PTL 1, an ECU including the electronic circuit board having the electronic elements implemented on both surfaces thereof, provided to the base member, has a space between the base member and the electronic circuit board, and thus there is a need to fill the resin into the space. As in PTL 1, when the resin is added to the ECU including the base member having the side wall, the resin filling into the space delays due to the side wall and a difference occurs in resin filling time between the upper and lower surfaces of the electronic circuit board. Thus, there is a possibility of deformation of the electronic circuit board.

An object of the present invention is to provide the structure of an ECU enabling resin to be filled without deformation of an electronic circuit board.

Solution to Problem

Means to the object of the present invention is, for example, as follows.

A vehicle-mounted control device includes: a circuit board having a broad surface and a side surface; a base member housing the circuit board; and resin filled between the circuit board and the base member. The base member has: a plate-shaped portion opposed to the broad surface; and a side wall protruding from the plate-shaped portion, the side wall being opposed to the side surface. The resin is provided at least between the circuit board and the broad surface. The side wall has an opening at any position on the side of the plate-shaped portion from a position opposed to the side surface.

The opening of the side wall at any position on the side of the plate-shaped portion from the position opposed to the side surface, can inhibit a difference in resin filling time between the upper and lower surfaces of the circuit board, from occurring.

Advantageous Effects of Invention

According to the present invention, the structure of the ECU enabling the resin to be filled without the deformation of the electronic circuit board, can be provided.

DESCRIPTION OF EMBODIMENTS

Embodiments of the present invention will be described below with the drawings. The same constituent members, the same functional portions, or portions in corresponding relationship are denoted with uniform reference signs or related reference signs in the figures. Note that, for example, each portion in thickness has been exaggeratingly illustrated in FIGS. 1 to 12 in order to easily understand the present invention.

First Embodiment

Figure 1:
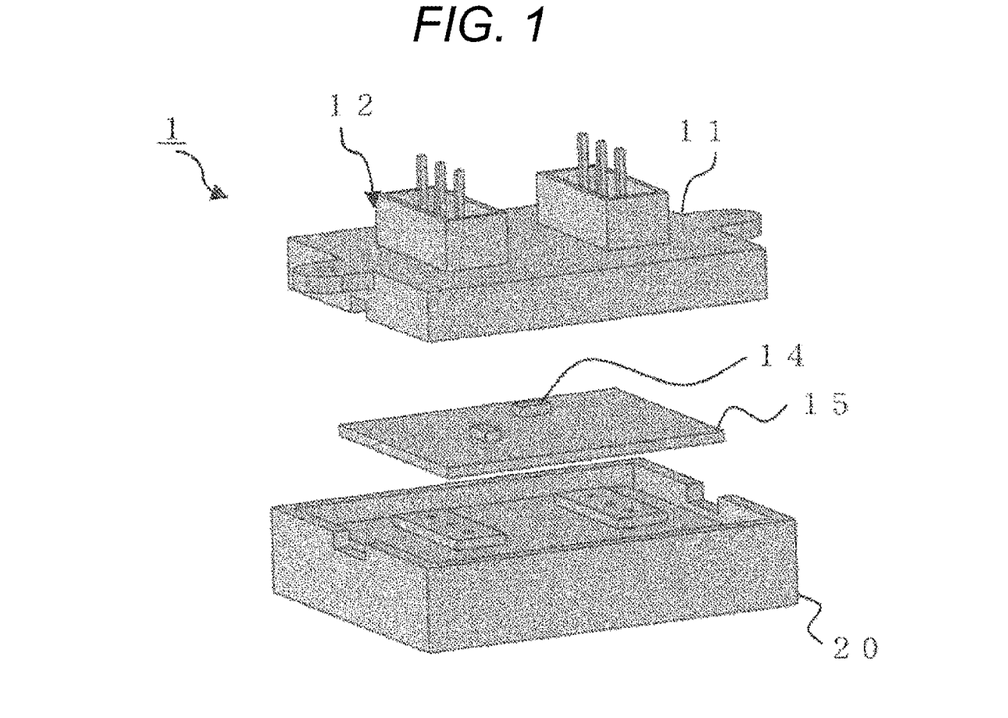
FIG. 1 is an exploded perspective view of the main structure of a resin-sealed vehicle-mounted control device 1 according to a first embodiment.

FIG. 1 is an exploded perspective view of the main structure of a resin-sealed vehicle-mounted control device 1 according to a first embodiment.

The resin-sealed vehicle-mounted control device 1 includes: a circuit board 15 having electronic components 14 implemented on the upper and lower (front and back) surfaces of the circuit board 15 with solder, the electronic components 14 each including a heating element, such as an IC or a semiconductor element; a base member 11 housing the circuit board; and a connector 12. The circuit board 15 has resin 20 filled on both surfaces thereof, and the resin 20 not illustrated is also filled between the circuit board 15 and the base member 11.

Figure 2:
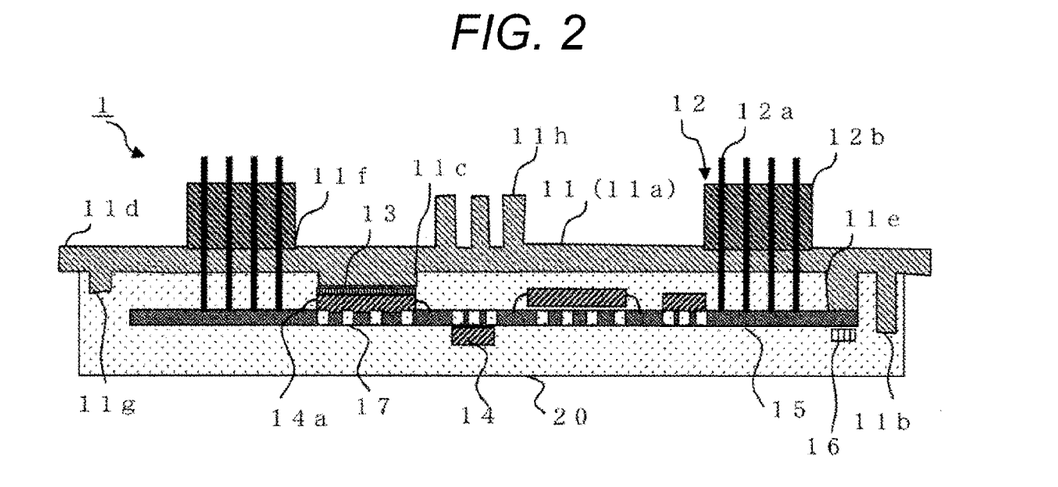
FIG. 2 is a sectional view of FIG. 1.

FIG. 2 is a sectional view of FIG. 1.

The connector 12 for electrically connecting the circuit board 15 with the external is attached to the circuit board 15. The connector 12 includes: a necessary number of pin terminals 12a; and a housing 12b having through holes through which the pin terminals 12a are inserted, for example, by press fit. For the connector 12, the lower end portions of the pin terminals 12a are coupled and connected to the circuit board 15 with solder, for example, by a spot flow process after the insertion of the pin terminals 12a into the through holes of the housing.

The base member 11 with a bowl-like shape having one side open, includes: a plate-shaped portion 11a having the circuit board 15 implemented; a side wall 11b protruding from the plate-shaped portion 11a; a bearing portion 11c being the bearing surface of the circuit board 15; a vehicle integrating fixing portion 11d extending from the circumference of the plate-shaped portion 11a; corner bearing portions 11e provided at the four corners of the plate-shaped portion 11a; a connector window 11f for inserting the connector into the plate upper portion 11a; and an opening 11g provided to the side wall 1ib. The side wall 11b is provided in a wall shape, protruding from the edge of the plate-shaped portion 11a, and thus the entire base member 11 has a case-like shape in which the circuit board 15 is housed.

The circuit board 15 is plate-shaped, and has a broad surface and a side surface. The broad surface is provided such that the broad surface is opposed to the plate-shaped portion 11a of the base member, and the side wall 11b is provided such that the side wall 11b is opposed to the side surface of the circuit board 15. The provision of the side wall 11b such that the side wall 11b is opposed to the side surface of the circuit board 15, protects the electronic components 14, for example, from an external electromagnetic wave, so that electro-magnetic compatibility can be maintained.

The opening 11g for inserting the resin material 20 for sealing the vehicle-mounted control device, is provided at part of the side wall 11b. Although the resin 20 is filled from the side of the side surface of the circuit board 15 as to be described later (from the left side in FIG. 2), the presence of the opening 11g causes the side wall 11b to hardly interfere with the filling of the resin 20.

The vehicle integrating fixing portion 11d allows the resin-sealed vehicle-mounted control device 1 to be integrated with a vehicle body, and is fixed in a predetermined region of the vehicle body, for example, with engagement of a kind of bolt. The corner bearing portions 11e provided at the four corners of the base, hold the circuit board, and each fixes the circuit board with a setscrew 16 as an exemplary fastening member. A fin 11h may be provided in order to improve the heat dissipation of the base member 11.

The resin material 20 is filled on both surfaces of the circuit board 15, the resin material 20 covering the circuit board 15. The side wall 11b is also covered with the resin material 20. The covering of the circuit board 15 with the resin material 20 covers the electronic components 14, the front and back surfaces of the circuit board, a space between the base member 11 and the circuit board 15, and the pin terminals of the connector connected to the circuit board, with the resin material. The filling of the resin material 20 ensures the reliability of the ECU, such as thermal resistance, waterproof property, and salt water resistance. For the electronic components 14 and the circuit board 15 subjected to the soldering or the pin terminals 12a and the circuit board 11 subjected to the soldering, the soldered portions are also covered with the resin material 20, and thus solder deformation is reduced and the reliability improves. An electronic component 14 positioned in the vicinity of the center from three electronic components 14 implemented on the upper surface side of the circuit board 15, is attached floating from the upper surface of the circuit board 11 with the terminals of the electronic component 14, and thus there is a gap formed between the electronic component 14 and the circuit board 11. The resin material 20 for sealing the vehicle-mounted control device may be filled in the gap portion and a thermal via 17. The resin 20 is higher in thermal conductivity than air, and thus the covering of the circuit board having the electronic components implemented, with the resin material, improves heat dissipation.

As an exemplary material of the resin material 20, a conventional thermosetting resin, such as an epoxy resin, a phenolic resin, a urethane resin, or an unsaturated polyester resin, can be used. The most preferable resin from the resins is the unsaturated polyester resin that is inexpensive.

The base member 11 is manufactured by casting, pressing, or cutting with metal material. The base member 11 is manufactured by the casting, the pressing, or the cutting with, as the material, an alloy including aluminum, magnesium, and iron as main components. Note that, the connector window 11f is formed on the base member 11 in order to allow the circuit board to be supplied with power from the external or the circuit board to receive and send an input signal from and an output signal to an external device, respectively, through the connector.

The circuit board 15 has both surfaces provided with the electronic components 14. A quartet of the electronic components 14 for control is implemented (three on the upper surface side and one on the lower surface side) in FIG. 2. Circuit wiring 14a provided to the circuit board, is connected to each electronic component and is also connected to the pin terminals 12a of the connector. The electronic components for control each include a microcomputer and a power semiconductor element. Thermal vias (through holes 17) are provided to the portions of the circuit board 11 on which the electronic components 14 are implemented. A rectangular protrusion 11c protrudes on the upper side of an electronic component positioned on the left portion from the three electronic components implemented on the upper surface side of the circuit board, and a high thermal conductive layer 13 is interposed between the upper surface of the electronic component and the lower surface of the rectangular protrusion 11c of the base, the two being in contact with each other. In this case, the high thermal conductive layer 13 includes an adhesive, grease, and a heat dissipating sheet.

The connector 12 may be adhered to the connector window 11f of the base member 11 with an adhesive. A publicly known adhesive may be used as the adhesive, and examples of the adhesive that can be used, include, but are not particularly limited to, a silicon adhesive, an epoxy-resin-based adhesive, a polyurethane adhesive, a bismaleimide adhesive, a phenolic-resin-based adhesive, and an acrylic-resin-based adhesive.

Next, an exemplary assembling process of the resin-sealed vehicle-mounted control device 1, will be described.

Figure 3:
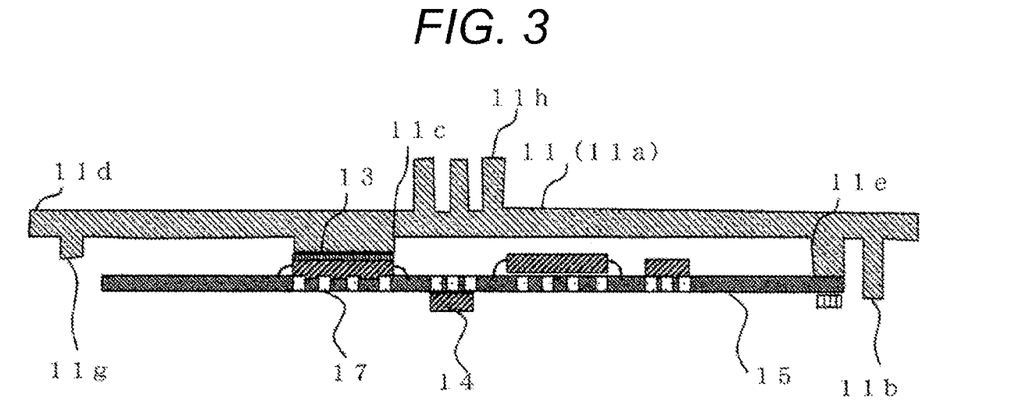
FIG. 3 is a view for describing an exemplary assembling (fixing) process.

FIG. 3 is a view for describing an exemplary assembling (fixing) process.

As illustrated in FIG. 3, the circuit board 15 having the electronic components 14 implemented with the solder, and the base member 11 are first fixed together. As a fixing method, for example, screw fixation can be used. The base member 11 is abutted on and fixed to the corner bearing portions 11e with the setscrews 16. The corner bearing portions 11e can be provided, for example, to either the four corners or end portions of the base member 11. As a fixing method, fixation may be made, for example, with an adhesive or an adhesive tape instead of the screw fixation.

Figure 4:
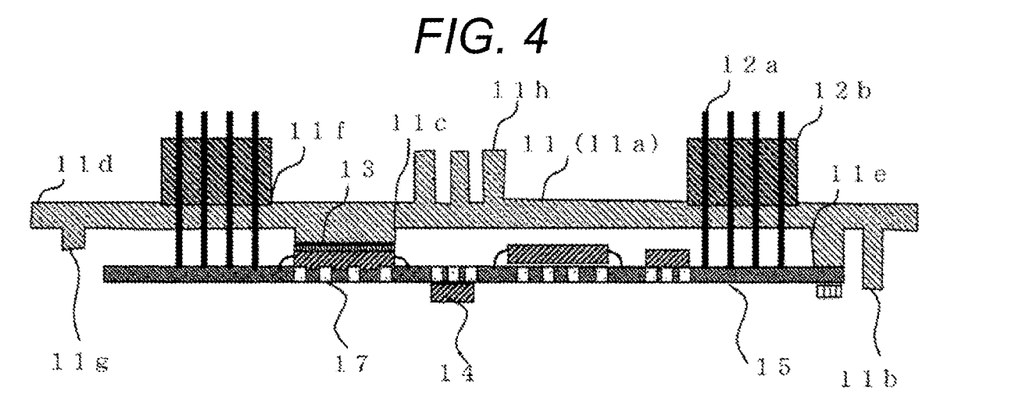
FIG. 4 is a view of an exemplary assembling (connector attachment) process.

FIG. 4 is a view of an exemplary assembling (connector attachment) process.

The pin terminals 12a are integrated with the housing 12b and then the connector 12 is attached to the connector window 11f of the base member 11. An adhesive may be used for the attachment. The pin terminals 12a are connected to the circuit board 15 through the base member 11. As a connecting method, for example, the spot flow process with solder can be used. In order to prevent the resin from overflowing from the holes through which the pin terminals 12a are inserted, in filling the resin material 20 into the base member 11 at the subsequent process, potting may be made, for example, with a urethane resin after the integration of the pin terminals 12a with the housing 12b.

Figure 5:
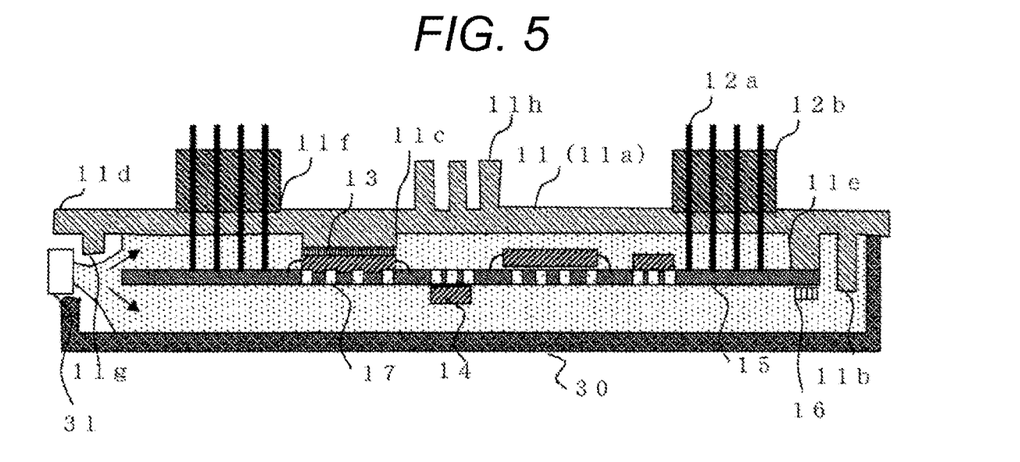
FIG. 5 is a view of an exemplary assembling (resin filling) process.

FIG. 5 is a view of an exemplary assembling (resin filling) process.

After the electrical connection of the electronic components 14 and the pin terminals 12a, as illustrated in FIG. 5, the circuit board 15, the connector 12, and the base member 11 are sealed with the resin material 20. A die 30 is first attached to the opening side of the base member 11. The die 30 can be abutted on and fixed to the plate-shaped portion 11a of the base member or the vehicle integrating fixing portion 11d. The die 30 has a resin inlet 30a for filling the resin material 20 from the side of the side wall 11b of the resin-sealed vehicle-mounted control device 1. A nozzle 31 is set at the resin inlet 30a, and the nozzle 31 ejects the resin material 20 having fluidity, to inject the resin material 20 into the base and the die. The resin material 20 ejected from the nozzle 31 flows from the side of the side surface of the circuit board and branches into both surfaces of the circuit board 15 (arrows in the figure), so that the resin material 20 is filled along the board surfaces. The resin material 20 is filled almost simultaneously on both surfaces of the circuit board 15, and thus deformation due to occurrence of a difference in resin filling time between the upper and lower surfaces of the circuit board, can be inhibited. When there is the difference in resin filling time between the upper and lower surfaces of the circuit board, the circuit board 15 deforms due to the insertion pressure of the resin material having high viscosity. Particularly, when the filling speed of the resin is high, the difference highly probably causes a problem. In order to perform the filling almost simultaneously on both surfaces of the circuit board 15, it is important that the opening 11g is provided to the side wall 11b of the base member 11. The side wall 11b has the opening 11g provided on the side of the plate-shaped portion 11a from the position at which the side wall 11b and the side surface side of the circuit board 15 are opposed to each other. The provision of the opening at the position can prevent the side wall 11b from interfering with the filling of the resin between the base member 11 and the circuit board 15.

After the filling of the resin material having the fluidity by a predetermined amount into the base member 11 and the die, the resin material 20 is cured, for example, by heating. This arrangement allows the resin-sealed vehicle-mounted control device illustrated in FIG. 2, to be manufactured.

Figure 6:
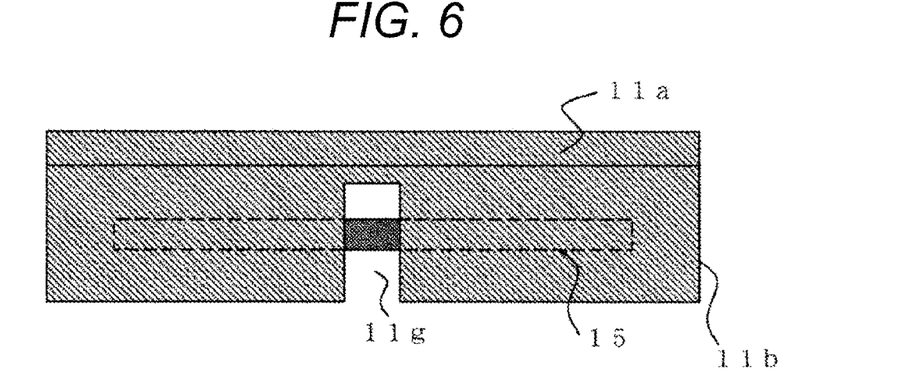
FIG. 6 is a schematic view of the positional relationship between an opening 11g of a base member 11 and a circuit board 15.

FIG. 6 is a schematic view of the positional relationship between the opening 11g of the base member 11 and the circuit board 15 when the resin-sealed vehicle-mounted control device 1 is viewed from a side surface (view viewed from the left side of FIG. 5).

According to the first embodiment, the opening 11g is provided in a notch shape to the side wall 11b. The end portion of the notch is positioned, in the side wall 11b, on the side of the plate-shaped portion 11a from the position at which the side wall 11b and the side surface side of the circuit board 15 are opposed to each other, and thus the side wall 11b has the opening on the side of the plate-shaped portion 11a from the position at which the side wall 11b and the side surface side of the circuit board 15 are opposed to each other.

The resin material 20 is filled into the base member, flowing from the opening 11g provided in the notch shape and an end portion of the side wall 11b (lower side in the figure). No lag occurs in the filling of the resin material 20 onto both surfaces of the circuit board 15 as the opening 11g is larger in size, and thus the opening 11g is preferably large in size in consideration of deformation of the circuit board 15. However, the opening 11g is preferably small in size in consideration of influence to the EMC. Therefore, the position, shape, and size of the opening 11g are preferably provided in consideration of the positions of the electronic components 14 on the circuit board 15.

The resin-sealed vehicle-mounted control device 1 is manufactured by the manufacturing method of FIGS. 3 to 5. The resin-sealed vehicle-mounted control device 1 is fixed, for example, to a vehicle member in an engine room. The resin-sealed vehicle-mounted control device can be fixed to the vehicle member by fastening a fastening member, such as a bolt, inserted through a through hole (not illustrated) of the vehicle integrating fixing portion 11d of the base member 11.

The resin-sealed vehicle-mounted control device 1 according to the first embodiment, has the electronic components implemented on both surfaces of the circuit board 15, and thus is achieved in miniaturization in comparison to single-sided implementation. The sealing of the circuit board 15, the base member 11, and the connector 12 with the resin material 20, increases rigidity, so that vibration proof can improve. The opening of the side wall 11b of the base member 11 on the side of the plate-shaped portion 11a from the position opposed to the side wall side of the circuit board 15, allows the resin material 20 to be filled almost simultaneously into the upper and lower spaces of the circuit boards 15. This arrangement can inhibit the circuit board from deforming due to the difference in the filling speed of the resin material between the upper and lower spaces of the circuit board, so that the circuit board and the resin material can be inhibited from being detached from each other or the electronic components and the resin material can be inhibited from being detached from each other, after the curing of the resin material 20 filled. Since dissociation is small in resin filling time between the front and back surfaces of the circuit board 15, the need of limiting the injection pressure of the resin material 20 is low. Thus, air to be involved in filling the resin material 20 can be reduced and the reliability of the device can improve.

Second Embodiment

Figure 7:
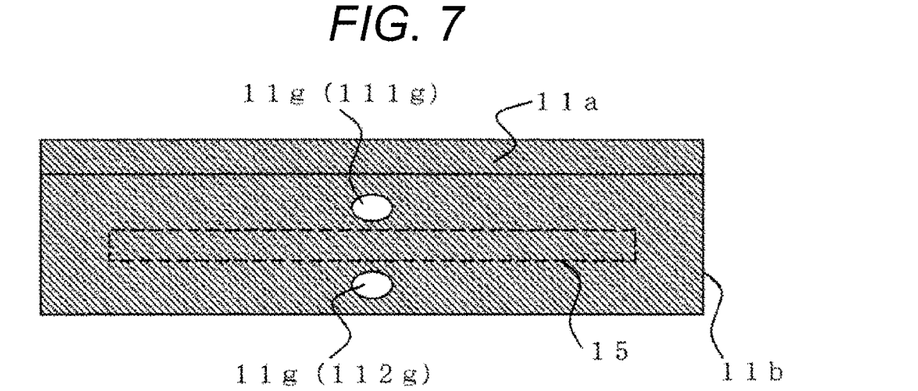
FIG. 7 is a schematic view of the positional relationship between an opening 11g of a base member 11 and a circuit board 15 and the shape of the opening 11g in a resin-sealed vehicle-mounted control device 1 according to a second embodiment.

FIG. 7 is a schematic view of the positional relationship between an opening 11g of a base member 11 and a circuit board 15 and the shape of the opening 11g in a resin-sealed vehicle-mounted control device 1 according to a second embodiment.

The opening 11g has the notch shape according to the second embodiment, whereas a plate-shaped-portion-sided opening 111g and an end-portion-sided opening 112g are independently provided as the opening 11g according to the second embodiment.

Resin material 20 is filled from the plate-shaped-portion-sided opening 111g, the end-portion-sided opening 112g, and an end portion of a side wall 11b, into the base member 11. The resin material 20 is added onto both surfaces of the circuit board 15 through the openings, and thus deformation of the circuit board 15 is smaller in comparison to addition of the resin material from the side of a single surface of the circuit board 15. The shape of each of the plate-shaped-portion-sided opening 111g and the end-portion-sided opening 112g is not limited to an elliptical shape, and thus any shape, such as a quadratic shape or a circular shape, can be adopted.

Third Embodiment

Figure 8:
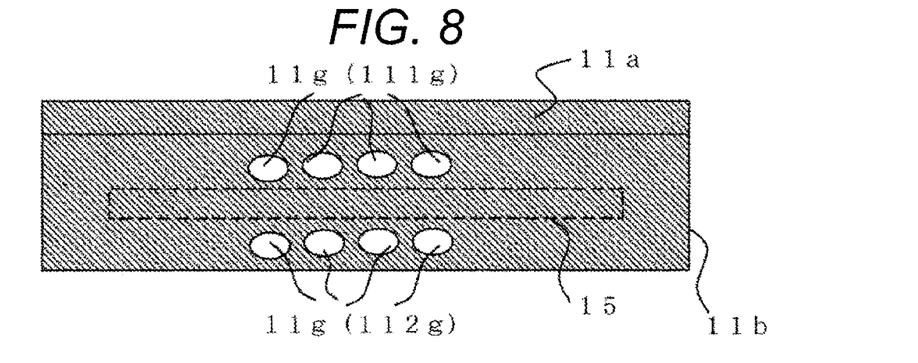
FIG. 8 is a schematic view of the positional relationship between an opening 11g of a base member 11 and a circuit board 15 and the shape of the opening 11g in a resin-sealed vehicle-mounted control device 1 according to a third embodiment.

FIG. 8 is a schematic view of the positional relationship between an opening 11g of a base member 11 and a circuit board 15 and the shape of the opening 11g in a resin-sealed vehicle-mounted control device 1 according to a third embodiment.

According to the third embodiment, a plurality of plate-shaped-portion-sided openings 111g and a plurality of end-portion-sided openings 112g are provided for the second embodiment.

Resin material 20 is filled from the plate-shaped-portion-sided openings 111g, the end-portion-sided openings 112g, and an end portion of a side wall 11b, into the base member 11. The resin material 20 is added onto both surfaces of the circuit board 15 through the openings, and thus deformation of the circuit board 15 is smaller in comparison to addition of the resin material from the side of a single surface of the circuit board 15. The shape of each of the plate-shaped-portion-sided openings 111g and the end-portion-sided openings 112g is not limited to an elliptical shape, and thus any shape, such as a quadratic shape or a circular shape, can be adopted.

Fourth Embodiment

Figure 9:
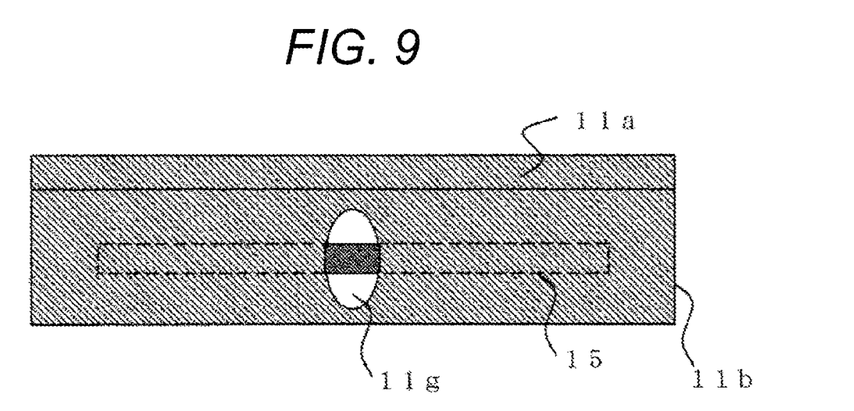
FIG. 9 is a schematic view of the positional relationship between an opening 11g of a base member 11 and a circuit board 15 and the shape of the opening 11g in a resin-sealed vehicle-mounted control device 1 according to a fourth embodiment.

FIG. 9 is a schematic view of the positional relationship between an opening 11g of a base member 11 and a circuit board 15 and the shape of the opening 11g in a resin-sealed vehicle-mounted control device 1 according to a fourth embodiment.

According to the fourth embodiment, the opening 11g is provided in an elliptical shape. A side wall 11b has the opening 11g as a single opening provided from the side of a plate-shaped portion 11a from the position opposed to a side surface of the circuit board 15, to the side of an end portion of the side wall from the position opposed to the side surface.

Resin material 20 is inserted from the opening 11g, to collide against the side surface of the circuit board 15. Then, the resin material 20 branches into both surfaces of the circuit board 15, to be added to the base member 11. Therefore, a difference hardly occurs in the adding time of the resin material 20 between both surfaces of the circuit board 15, and thus the circuit board 15 can be inhibited from deforming.

The shape of the opening 11g is not limited to the elliptical shape, and thus any shape, such as a quadratic shape or a circular shape, can be adopted.

Fifth Embodiment

Figure 10:
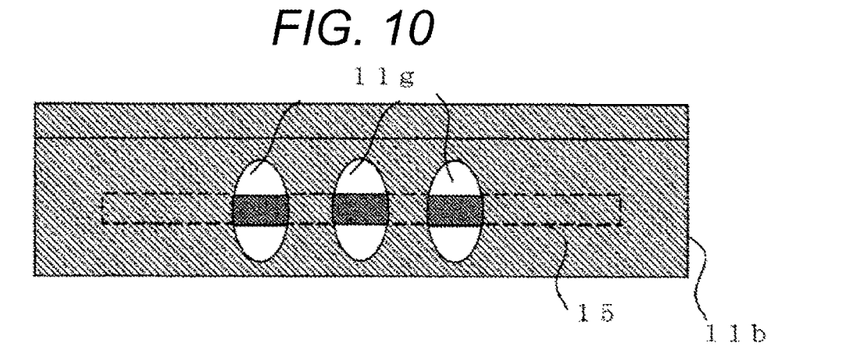
FIG. 10 is a schematic view of the positional relationship between an opening 11g of a base member 11 and a circuit board 15 and the shape of the opening 11g in a resin-sealed vehicle-mounted control device 1 according to a fifth embodiment.

FIG. 10 is a schematic view of the positional relationship between an opening 11g of a base member 11 and a circuit board 15 and the shape of the opening 11g in a resin-sealed vehicle-mounted control device 1 according to a fifth embodiment.

According to the fifth embodiment, a plurality of openings 11g is provided for the fourth embodiment.

Resin material 20 is inserted from the openings 11g, to collide against a side surface of the circuit board 15. Then, the resin material 20 branches into both surfaces of the circuit board 15, to be added to the base member 11. Therefore, a difference hardly occurs in the adding time of the resin material 20 between both surfaces of the circuit board 15, and thus the circuit board 15 can be inhibited from deforming. The shape of each of the openings 11g is not limited to an elliptical shape, and thus any shape, such as a quadratic shape or a circular shape, can be adopted.

Sixth Embodiment

Figure 11:
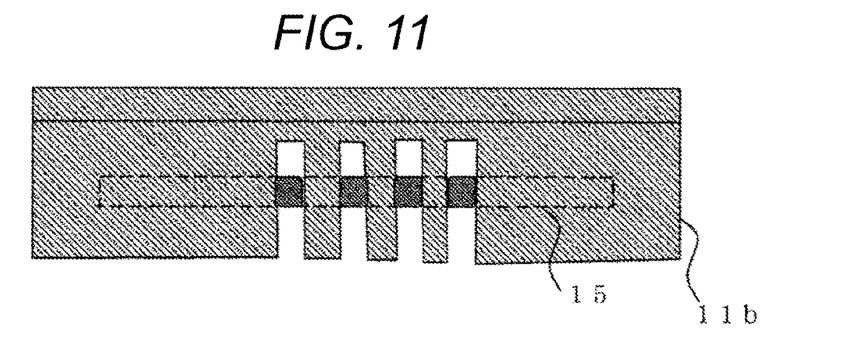
FIG. 11 is a schematic view of the positional relationship between an opening 11g of a base member 11 and a circuit board 15 and the shape of the opening 11g in a resin-sealed vehicle-mounted control device 1 according to a sixth embodiment.

FIG. 11 is a schematic view of the positional relationship between an opening 11g of a base member 11 and a circuit board 15 and the shape of the opening 11g in a resin-sealed vehicle-mounted control device 1 according to a sixth embodiment.

According to the fifth embodiment, a plurality of openings 11g is provided for the first embodiment, the openings 11g each having a notch shape.

Resin material 20 is inserted from the openings 11g, to collide against a side surface of the circuit board 15. Then, the resin material 20 branches into both surfaces of the circuit board 15, to be added to the base member 11. Therefore, a difference hardly occurs in the adding time of the resin material 20 between both surfaces of the circuit board 15, and thus the circuit board 15 can be inhibited from deforming.

The shape of each of the openings 11g is not limited to a quadratic shape, and thus any shape, such as a semi-elliptical shape, can be adopted.

Seventh Embodiment

Figure 12:
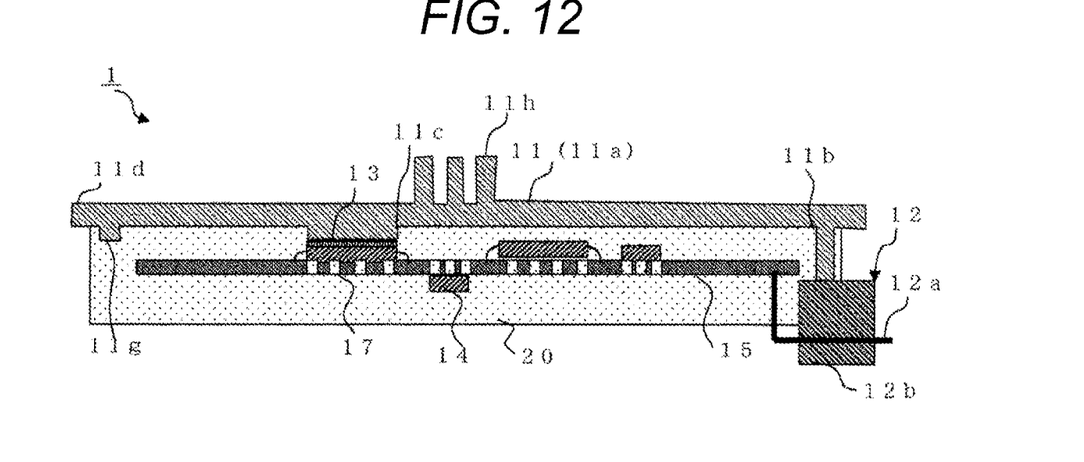
FIG. 12 is a schematic view of a resin-sealed vehicle-mounted control device 1 according to a seventh embodiment.

FIG. 12 is a schematic view of a resin-sealed vehicle-mounted control device 1 according to a seventh embodiment.

FIG. 12 illustrates a modification of the first embodiment, and is a sectional view at a position similar to those of FIGS. 2 to 5. A connector 12 can be positioned on the side wall side of a base member 11.

Eighth Embodiment

Figure 13:
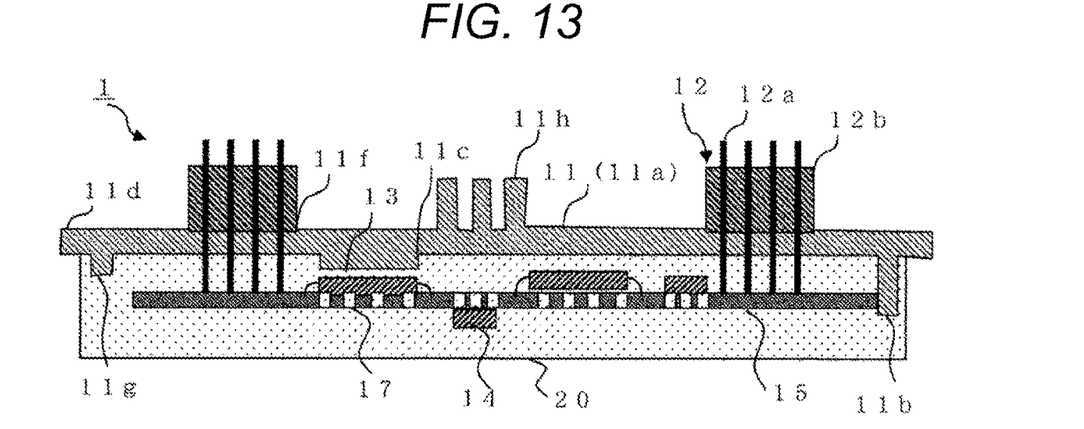
FIG. 13 is a schematic view of a resin-sealed vehicle-mounted control device 1 according to an eighth embodiment.

FIG. 13 is a schematic view of a resin-sealed vehicle-mounted control device 1 according to an eighth embodiment.

The eighth embodiment is a modification of the first embodiment, and FIG. 13 is a sectional view at a position similar to those of FIGS. 2 to 5.

According to the thirteenth embodiment, for a side wall 11b of the resin-sealed vehicle-mounted control device 1, the side wall 11b on the opposite side to the side wall 11b provided with an opening 11g, is in contact with a side surface of a circuit board 15. The structure allows the amount of resin material 20 to be used, to be reduced, the electro-magnetic compatibility of the vehicle-mounted control device to improve, and vibration proof to improve, so that the reliability of the device improves.

Ninth Embodiment

Figure 14:
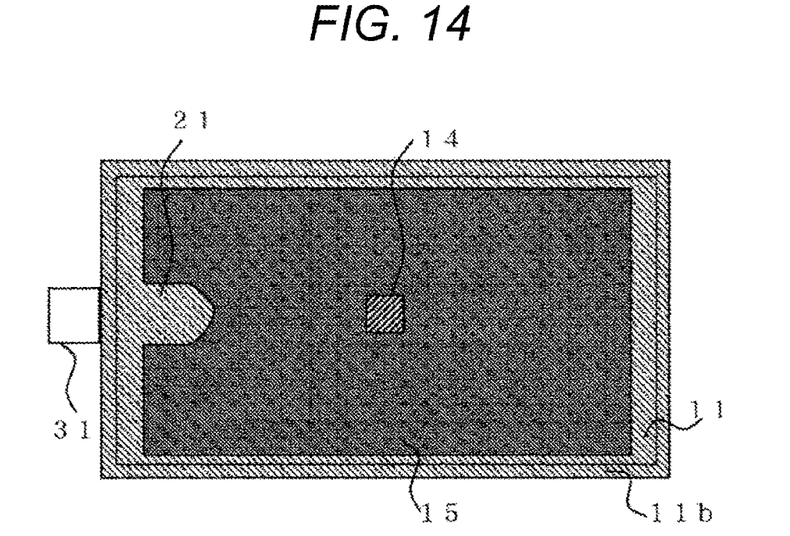
FIG. 14 is a schematic view of a resin-sealed vehicle-mounted control device 1 according to an eighth embodiment.

FIG. 14 is a schematic view of a resin-sealed vehicle-mounted control device 1 according to an eighth embodiment.

According to the ninth embodiment, a circuit board 15 is further provided with a circuit board notch 21 for the first embodiment.

The circuit board notch 21 is provided at a portion opposed to an opening 11g, in the circuit board 15.

Resin material 20 inserted from a nozzle 31 is filled on both surfaces of the circuit board 15 through the opening 11g. The provision of the circuit board notch 21 causes a difference in resin filling speed between both surfaces of the circuit board 15, to be further reduced, so that deformation of the circuit board 15 can be further reduced.

REFERENCE SIGNS LIST 1 resin-sealed vehicle-mounted control device
11 base member
11a plate-shaped portion
11b side wall
11c bearing portion
11d vehicle integrating fixing portion
11e corner bearing portion
11f connector window
11g opening
111g first opening
112g second opening
11h fin
12 connector
12a pin terminal
12b housing
13 high thermal conductive layer
14 electronic component
14a circuit wiring
15 circuit board
16 setscrew
17 thermal via
20 resin material
21 circuit board notch
30 die
30a resin inlet
31 nozzle

The invention claimed is:

1. A vehicle-mounted control device comprising:
a circuit board having a first surface, a second surface, a first side surface and a second side surface;
a base member housing the circuit board; and
a resin layer filled on both the first surface and the second surface of the circuit board,
wherein the base member includes:
a plate-shaped portion opposed to the first surface through the resin layer; and
a side wall protruding from the plate-shaped portion, the side wall being opposed to the second side surface, the side wall surrounding the circuit board, the side wall having an opening.

2. The vehicle-mounted control device according to claim 1,
wherein the opening of the side wall is provided on a side of the plate-shaped portion from a position opposed to the first side surface of the circuit board.

3. The vehicle-mounted control device according to claim 2,
wherein the opening is provided from the side of the plate-shaped portion from the position opposed to the first side surface, to a side of an end portion of the side wall from the position opposed to the second side surface.

4. The vehicle-mounted control device according to claim 3,
wherein the opening is provided in a notch shape from the side of the end portion of the side wall toward the plate-shaped portion.

5. The vehicle-mounted control device according to claim 4,
wherein a plurality of the openings is provided to the side wall.

6. The vehicle-mounted control device according to claim 5,
wherein the circuit board has a notch at a position opposed to the plurality of the openings.

7. The vehicle-mounted control device according to claim 2,
wherein the side wall has: a first opening as the opening at any position on the side of the plate-shaped portion from the position opposed to the first side surface; and a second opening as the opening at any position on the side of the plate-shaped portion from the position opposed to the first side surface.

8. The vehicle-mounted control device according to claim 7, wherein a plurality of the first openings and a plurality of the second openings are provided.

9. The vehicle-mounted control device according to claim 1 further comprising:
a connector, for electrically connecting the circuit board with a vehicle, is attached to the base member housing, and
wherein the connector includes a plurality of pin terminals, the plurality of pin terminals extend from outside the connector through the base member and the resin layer and connect to the circuit board.

* * * * *